(12) United States Patent
Tseng et al.

(10) Patent No.: US 12,733,116 B2
(45) Date of Patent: Sep. 8, 2026

(54) DUAL-AXIS HANDLE

(71) Applicant: HANWIT PRECISION INDUSTRIES LTD., New Taipei City (TW)

(72) Inventors: Ying-Chih Tseng, New Taipei City (TW); Ming-De Wu, New Taipei City (TW)

(73) Assignee: HANWIT PRECISION INDUSTRIES LTD., New Taipei City (TW)

(*) Notice: Subject to any disclaimer, the term of this patent is extended or adjusted under 35 U.S.C. 154(b) by 9 days.

(21) Appl. No.: 18/950,484

(22) Filed: Nov. 18, 2024

(65) Prior Publication Data

US 2026/0040466 A1 Feb. 5, 2026

Related U.S. Application Data

(63) Continuation-in-part of application No. 18/789,093, filed on Jul. 30, 2024.

(51) Int. Cl.
*H05K 5/02* (2006.01)
*H05K 7/14* (2006.01)

(52) U.S. Cl.
CPC ........... *H05K 5/023* (2013.01); *H05K 5/0221* (2013.01); *H05K 7/1411* (2013.01)

(58) Field of Classification Search
CPC .... H05K 5/023; H05K 5/0221; H05K 7/1411; G05G 1/04; E05D 3/10
See application file for complete search history.

(56) References Cited

U.S. PATENT DOCUMENTS

| | | | | |
|---|---|---|---|---|
| 5,208,735 A * | 5/1993 | Twachtmann | H05K 7/1411 403/18 |
| 7,125,272 B1 * | 10/2006 | Liang | H05K 7/1489 361/732 |
| 8,720,303 B2 * | 5/2014 | Wu | B62L 3/02 74/523 |
| 9,058,850 B2 * | 6/2015 | Hsiao | G11B 33/128 |
| 9,420,716 B2 * | 8/2016 | Ivey | H05K 7/1415 |
| 9,650,102 B1 * | 5/2017 | Wu | B62K 23/06 |
| 10,285,291 B1 * | 5/2019 | Lam | H05K 7/1489 |

(Continued)

FOREIGN PATENT DOCUMENTS

| | | | |
|---|---|---|---|
| CN | 115639879 A * | 1/2023 | H05K 7/1489 |
| JP | 2024065056 A * | 5/2024 | G11B 33/121 |

(Continued)

*Primary Examiner* — William L Miller
(74) *Attorney, Agent, or Firm* — MUNCY, GEISSLER, OLDS & LOWE, P.C.

(57) ABSTRACT

A dual-axis handle includes a base having an axial hole, a first pivot inserted into the axial hole and partially exposed from the base, a swing shaft having a shaft body pivotally connected to the outside of the first pivot and can be rotated 90 degrees in the horizontal direction and a second pivot extended from one side of the shaft body and arranged in a vertical direction to the first pivot, and a handle having a connecting body pivotally connected to the second pivot and a connecting groove provided on one side of the connecting body for receiving the partially exposed first pivot. The handle can be rotated 180 degrees vertically at the second pivot to avoid mechanical interference between the handle and the rack, and to facilitate the maintenance or replacement of electronic components inside the device box.

9 Claims, 11 Drawing Sheets

(56) References Cited

U.S. PATENT DOCUMENTS

| | | | | |
|---|---|---|---|---|
| 10,354,697 | B1 * | 7/2019 | Zhang | G11B 33/025 |
| 11,441,329 | B2 * | 9/2022 | Tseng | E05B 13/10 |
| 11,665,840 | B1 * | 5/2023 | O'Donnell | H05K 7/1409 361/801 |
| 12,031,363 | B2 * | 7/2024 | Yeh | H05K 5/0221 |
| 12,075,588 | B2 * | 8/2024 | Chia | H05K 7/1409 |
| 12,426,191 | B2 * | 9/2025 | Kumarasamy | H05K 7/1401 |
| 2016/0120056 | A1 * | 4/2016 | Kuang | E05C 3/042 403/322.4 |
| 2018/0168061 | A1 * | 6/2018 | Liao | G06F 1/181 |
| 2019/0090375 | A1 * | 3/2019 | Hsue | H05K 7/1489 |
| 2020/0061800 | A1 * | 2/2020 | Wu | B25G 3/08 |
| 2020/0112774 | A1 * | 4/2020 | Lee | H04Q 1/025 |
| 2020/0346711 | A1 * | 11/2020 | Wu | B62K 23/06 |
| 2021/0404212 | A1 * | 12/2021 | Tseng | E05C 3/045 |
| 2022/0349225 | A1 * | 11/2022 | Yeh | E05B 1/0046 |
| 2022/0369478 | A1 * | 11/2022 | Li | H05K 7/20272 |
| 2023/0126033 | A1 * | 4/2023 | Lee | H05K 7/1489 361/679.59 |
| 2023/0144465 | A1 * | 5/2023 | Chia | H05K 7/1409 312/223.2 |
| 2023/0320015 | A1 * | 10/2023 | Higby | H05K 7/1409 312/334.44 |
| 2024/0397657 | A1 * | 11/2024 | Lo | G06F 1/187 |
| 2025/0072605 | A1 * | 3/2025 | Chen | H05K 7/1401 |
| 2025/0287520 | A1 * | 9/2025 | Tsorng | H05K 7/1489 |
| 2025/0338413 | A1 * | 10/2025 | Wang | H05K 5/0221 |
| 2025/0351285 | A1 * | 11/2025 | Maguire | H05K 7/1411 |
| 2025/0374469 | A1 * | 12/2025 | Lin | H05K 7/1487 |
| 2025/0374471 | A1 * | 12/2025 | Wu | H05K 7/1489 |

FOREIGN PATENT DOCUMENTS

| | | | | |
|---|---|---|---|---|
| WO | WO-2013021388 | A1 * | 2/2013 | F16K 11/0782 |
| WO | WO-2023023334 | A1 * | 2/2023 | H05K 7/1461 |

* cited by examiner 5
62
6
3
31
610
61
14
2
423
41
42
443
431
44
442
16
43
432
443
4
14
2
111
31
610
61
12
42
1
11
3
6

DUAL-AXIS HANDLE

CROSS REFERENCE TO THE RELATED APPLICATIONS

This application is a Continuation-In-Part of application Ser. No. 18/789,093, filed on Jul. 30, 2024, for which priority is claimed under 35 U.S.C. § 120, the entire contents of which are hereby incorporated by reference.

BACKGROUND OF THE INVENTION

1. Field of the Invention

The present invention is a dual-axis handle, particularly dual-axis handles installed on both sides of a device box, with symmetrical racks on both sides of the device box and preset locking seats on the racks for positioning the handles in the storage state, and rails are provided between the adjacent racks on both sides. The handle can be rotated horizontally outward from the storage position at an inner angle of about 90 degrees between the handle and the base to disengage from the preset locking seat. After the swing shaft rotates horizontally in the base and the inner angle between the handle and the base is about 135 degrees, you can apply force to the two handles to drag the device box out in the first stage, and then rotate the handles vertically by 180 degrees with the respective second pivots as the axis (the inner angle between the handle and the base is still 135 degrees). Then rotate the two handles outward and make the inner angle between the handle and the base be about 180 degrees to avoid mechanical interference between the handles and the racks. Then, you can apply force to the two handles to completely pull the device box out in the second stage to facilitate the maintenance or replacement of the electronic components inside the device box.

2. Description of the Related Art

With the continuous progress and development of electronic technology, computer technology has brought people convenience, comfort, speed and other high-efficiency functions in life and work. Therefore, the application functions of electronic technology, computer systems, etc. are becoming increasingly powerful and their scope is becoming increasingly wider. In addition to general personal computers, there are also centrally managed systems such as industrial computer rooms, building central control systems, central control systems for automated factory operation systems, and central processing control systems for audio and video playback. It can simultaneously connect multiple computer hosts, servers, operating conversion systems, etc., and assemble them in a stacked manner inside a large electronic equipment chassis to form upper and lower stacked device boxes. The device boxes can be pulled out or pushed from the side of the electronic equipment chassis to assemble or repair various computer operating systems. Because multiple operating host systems are combined, when various computer operating systems need to be tested, updated, or other related operations, the device boxes on different layers must be pulled out of the electronic equipment chassis one by one to facilitate testing or related maintenance operations. Therefore, the various multi-layered device boxes assembled in the electronic equipment chassis are all provided with a simple buckling structure, so that each device box can be easily assembled inside the chassis or pulled out from the chassis by the buckling mechanism.

The stacked device boxes inside the electronic equipment chassis are equipped with various electronic and circuit systems. In addition to general word processing and application execution, they can also connect to the Internet to search for a lot of information. As a result, computers occupy a very important position in daily life and work. In addition to the related peripheral equipment, each device box also has a removable slot space for conveniently plugging in a mobile hard drive, or for electrically plugging in electronic devices such as a CD player or a multimedia player, in order to facilitate the expansion of data storage and the preservation and confidentiality of data. This means that applications can be expanded effectively without occupying the host space of each device box. However, the slot space set up in each host of the device box is a slot frame space composed of a fixed frame. When using the slot space to plug in electronic products, the assembly path or space is often blocked or restricted by the handle provided on the outside of the device box. This causes inconvenience in plugging and unplugging the electronic products and the host inside the device box, which needs to be improved.

Therefore, how to solve the inconvenience and trouble of pulling out and pushing each device box in the stacked electronic equipment chassis and the problem that the handle on each device box for pulling out easily obstruct the assembly path and space for the electronic circuit inside the device box and the external electronic products is the direction that the relevant manufacturers in this industry are eager to research and improve.

SUMMARY OF THE INVENTION

Therefore, in view of the above-mentioned problems and deficiencies, the inventor collected relevant information, and after many evaluations and considerations, he designed the invention of this dual-axis handle.

The main object of the present invention is that the dual-axis handle comprises a base comprising an axial hole; a first pivot inserted into the axial hole and partially exposed from the base; a swing shaft comprising a shaft body pivotally connected to the outside of the first pivot and can be rotated 90 degrees in the horizontal direction, and a second pivot extended from one side of the shaft body and arranged in a vertical direction to the first pivot; and a handle comprising a connecting body pivotally connected to the second pivot for enabling the handle to be rotated 180 degrees in a vertical direction at the second pivot and a connecting groove provided on one side of the connecting body for receiving the partially exposed first pivot. Based on the above, two dual-axis handles of the present invention are installed on both sides of a device box, and symmetrical racks are provided on both sides of the device box. Preset locking seats are provided on the racks for positioning the handles respectively in the storage state, and rails are provided between the adjacent racks on both sides. The handle can be rotated horizontally outward from the storage position at an inner angle of about 90 degrees between the handle and the base to disengage from the preset locking seat. After the swing shafts rotate horizontally in the respective bases and the inner angle between the handle and the base is about 135 degrees, you can apply force to the two handles to drag the device box out in the first stage, and then rotate the handles vertically by 180 degrees with the respective second pivots as the axis (the inner angle between the handle and the base is still 135 degrees), and then rotate the two handles outward and make the inner angle between the handle and the base be about 180 degrees to avoid mechanical interference between the handles and the racks. Then, you can apply force to the two handles to completely pull the device box out in the second stage to facilitate the maintenance or replacement of the electronic components inside the device box.

Another object of the present invention is that the base further comprises a first shaft seat, a second shaft seat, and a first axial hole and a second axial hole respectively formed in the first shaft seat and the second shaft seat to form the axial hole, a positioning space for accommodating the swing shaft formed between the first shaft seat and the second shaft seat, a first guide surface formed in the first shaft seat and extending downward and outward from the first axial hole, and a second guide surface formed in the second shaft seat and extending obliquely upward and outward from the second axial hole.

Still another object of the present invention is that the first shaft seat of the base comprises a first positioning groove and a second positioning groove recessed in an arc-shaped part thereof and facing the connecting body of the handle; the second shaft seat of the base comprises a third positioning groove and a fourth positioning groove recessed in an arc-shaped part thereof and facing the connecting body of the handle; the handle further comprises a positioning device set with a positioning bead assembled inside the connecting body; the first positioning groove, the second positioning groove, the third positioning groove and the fourth positioning groove are used for the positioning bead of the positioning device set to be held and positioned, and form a segmented positioning structure with multiple horizontal and vertical angles for the handle on the base.

Still another object of the present invention is that the positioning device set comprises an extension body protruding outward from the connecting body, an elastic member formed by a spring and a receiving chamber formed inside the extension body for receiving the elastic member and the positioning bead, so that when the positioning bead is accommodated in the first positioning groove, the inner angle between the handle and said base is about 90 degrees; when the positioning bead is accommodated in the second positioning groove, the inner angle between the handle and the base is about 135 degrees; when the positioning bead is accommodated in the third positioning groove, the inner angle between the handle and the base is about 135 degrees; when the positioning bead is accommodated in the fourth positioning groove, the inner angle between the handle and the base is about 180 degrees.

Still another object of the present invention is that the connecting body of the handle comprises a third axial hole for the second pivot to be inserted and positioned, a locking arm for locking in a preset locking seat and an operating portion for force application respectively formed on two opposite sides of the connecting body, a hook portion formed at the end of the operating portion and for engaging with a preset positioning seat; the locking arm has the connecting groove formed therein and comprises a guide slope that selectively contacts the first guide surface or the second guide surface, a zigzag positioning portion formed at the end of the locking arm for inserting into the preset locking seat coupled to a preset rack, a magnetic member and a through hole for receiving the magnetic member; the first pivot is made of a magnetically conductive material and the magnetic member and the first pivot generate a magnetic attraction so that the connecting groove and the first pivot are in a fitted state.

Still another object of the present invention is that the handle further comprises a vertical plate protruding from the operating portion and adjacent to the connecting body, an assembly space formed between the vertical plate and the connecting body, a swivel hook accommodated in the assembly space, a through slot, a fixing slot and a through hole respectively formed on the vertical plate, the connecting body and the swivel hook for a pin to be inserted and fixed, so that the swivel hook is rotatable in the assembly space, and a stopper block provided at a bottom side of the connecting body corresponding to the swivel hook; the base further comprises a buckle seat provided at a buckle position of the seat plate corresponding to the swivel hook, an L-shaped buckle groove located at the buckle seat, and a stop wall formed at a vertical portion of the buckle groove for the swivel hook to be supported and positioned.

Still another object of the present invention is that the swivel hook has the through hole passing through the center thereof, and comprises a rotary reset member, a receiving chamber for receiving the rotary reset member provided on one side thereof corresponding to the through hole of the swivel hook, and a hook-shaped engaging portion for engaging in the buckle groove of the buckle seat and an unlocking portion for force application respectively formed at two opposite ends thereof; and the rotary reset member is composed of a torsion spring.

DETAILED DESCRIPTION OF THE INVENTION

Figure 1:
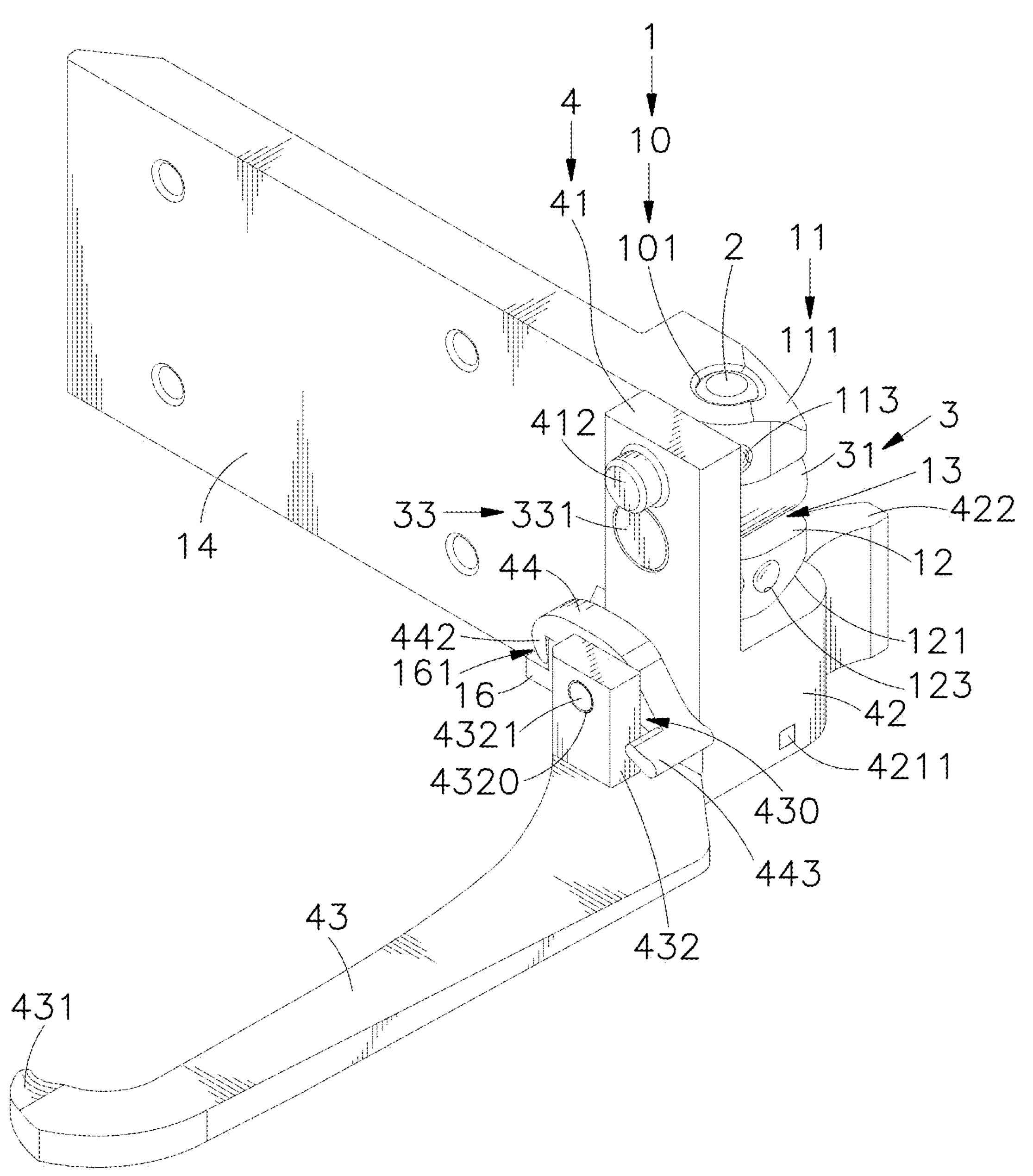
FIG. 1 is a three-dimensional external view of the dual-axis handle of the present invention.
Figure 2:
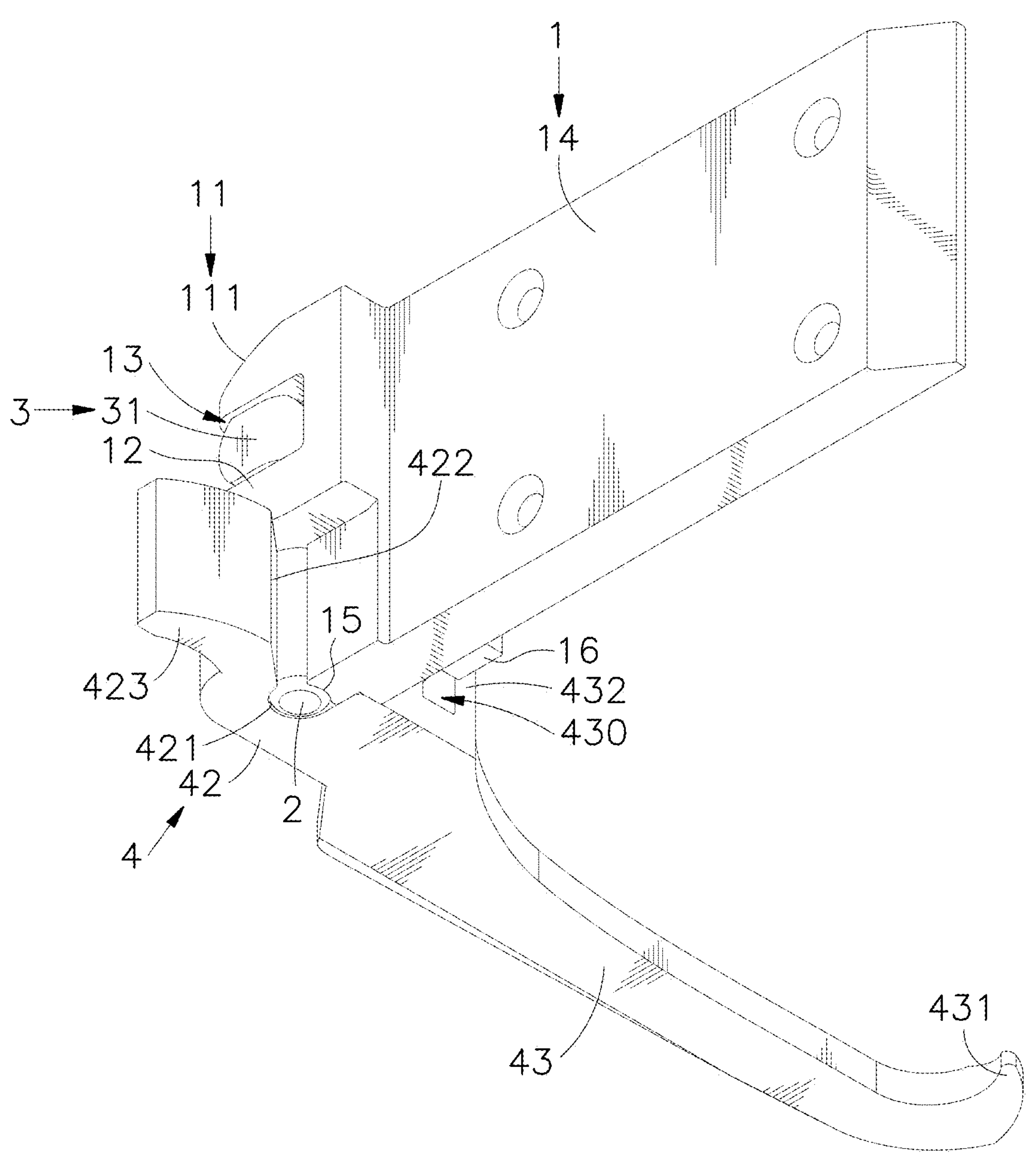
FIG. 2 is a three-dimensional external view of the dual-axis handle of the present invention from another viewing angle.
Figure 3:
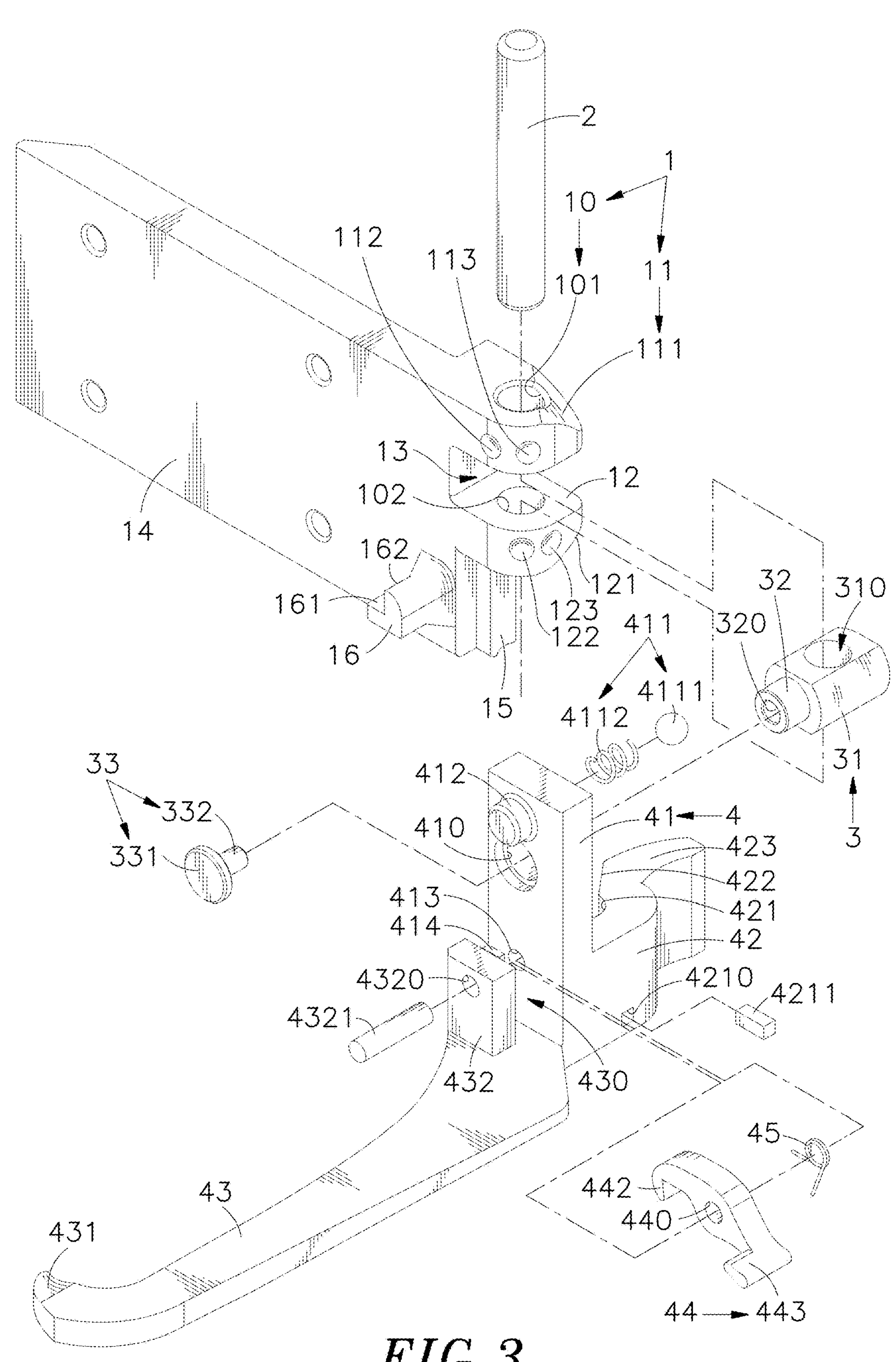
FIG. 3 is a three-dimensional exploded view of the dual-axis handle of the present invention.
Figure 4:
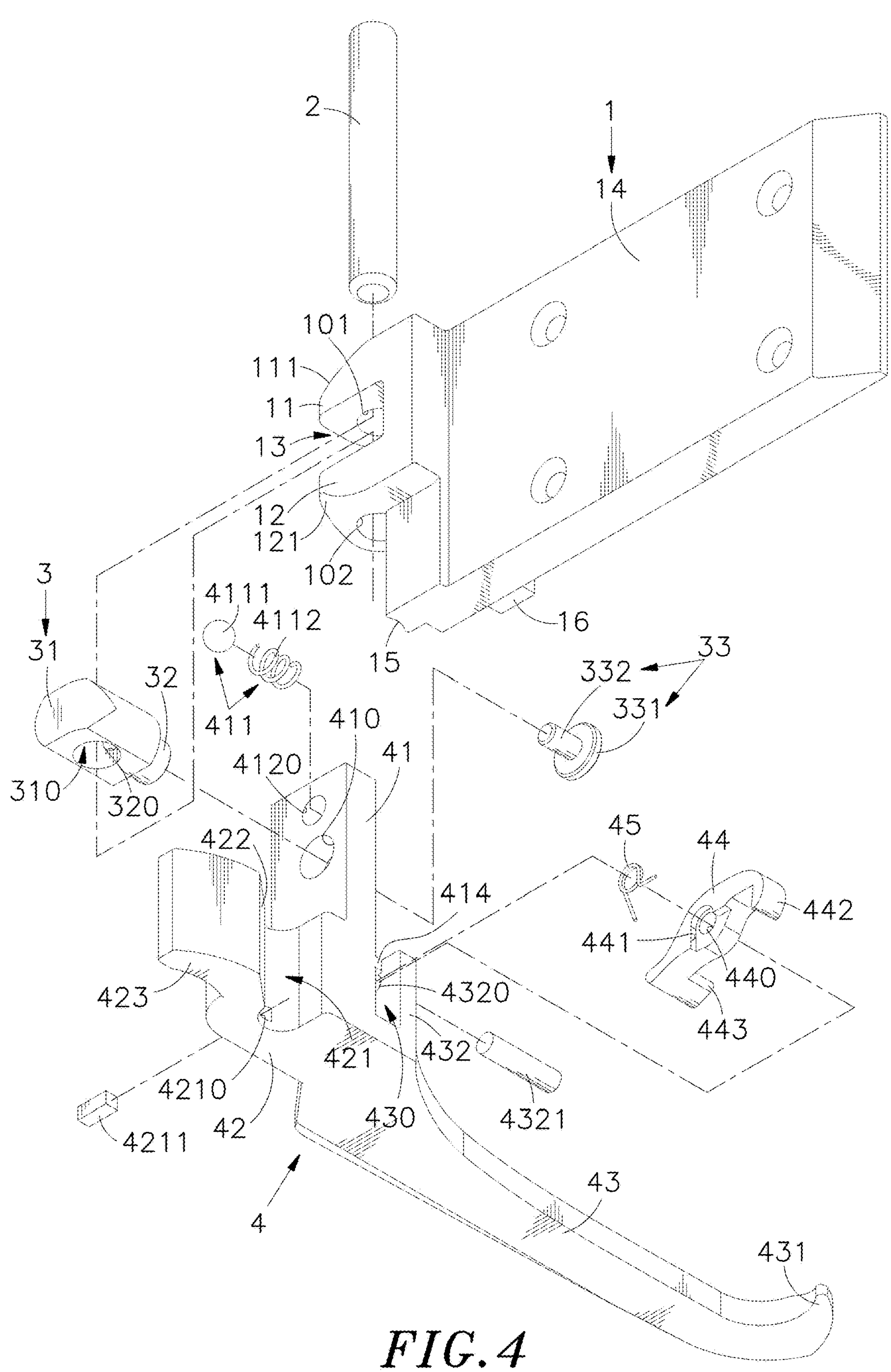
FIG. 4 is a three-dimensional exploded view of the dual-axis handle of the present invention from another viewing angle.
Figure 5:
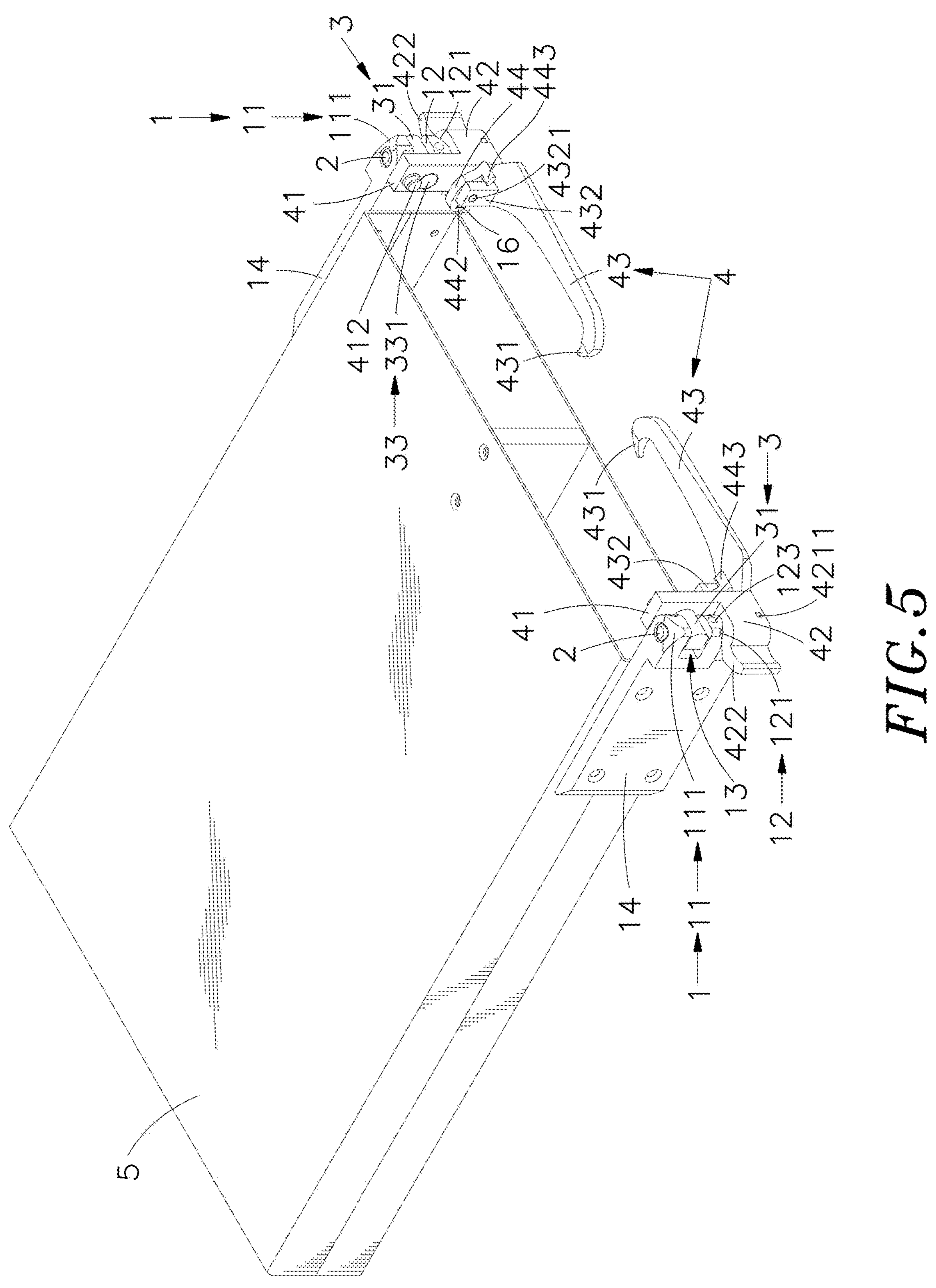
FIG. 5 is a three-dimensional view of the dual-axis handles of the present invention installed on both sides of the chassis.
Figure 6:
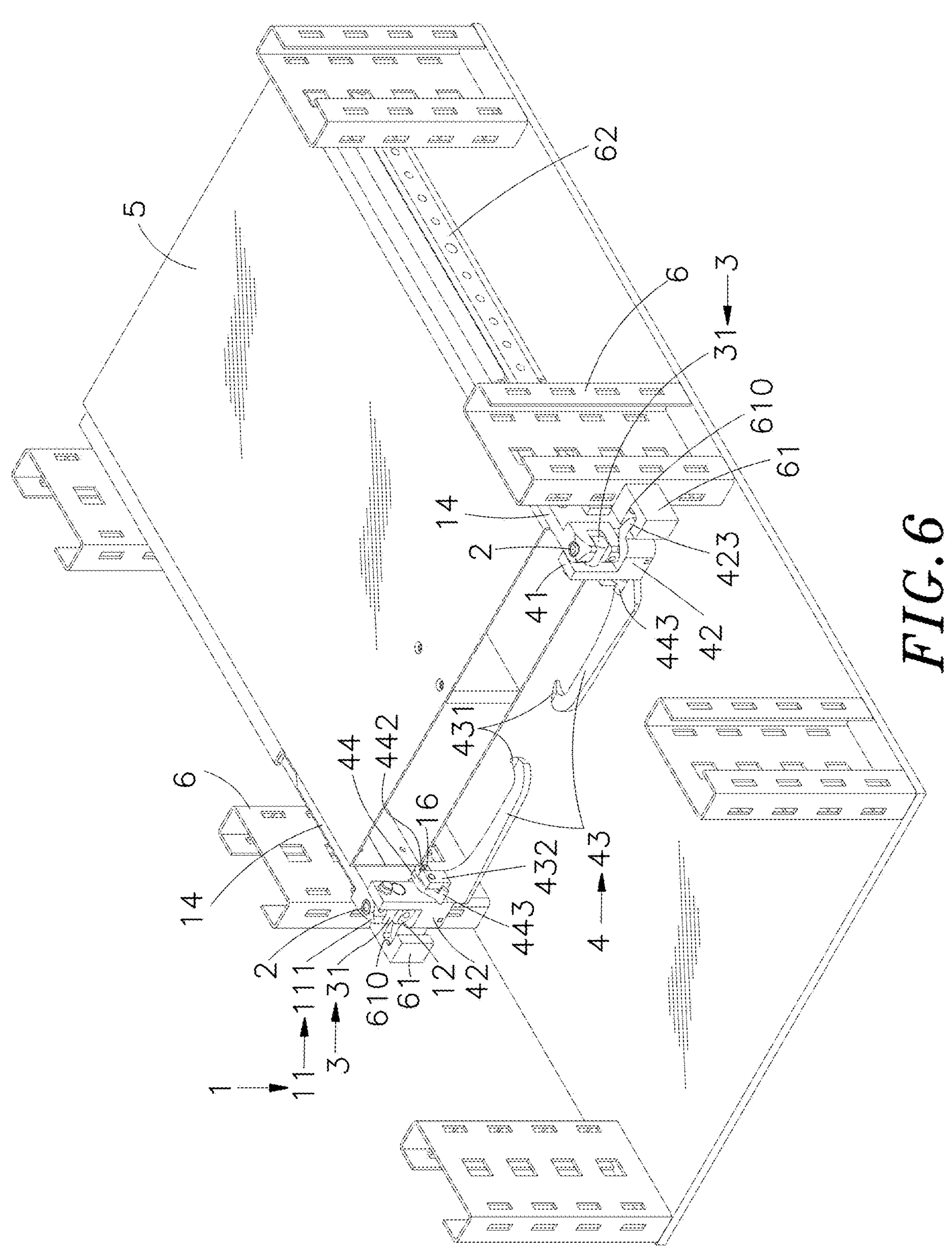
FIG. 6 is a three-dimensional view of an implementation example of the dual-axis handle of the present invention.
Figure 7:
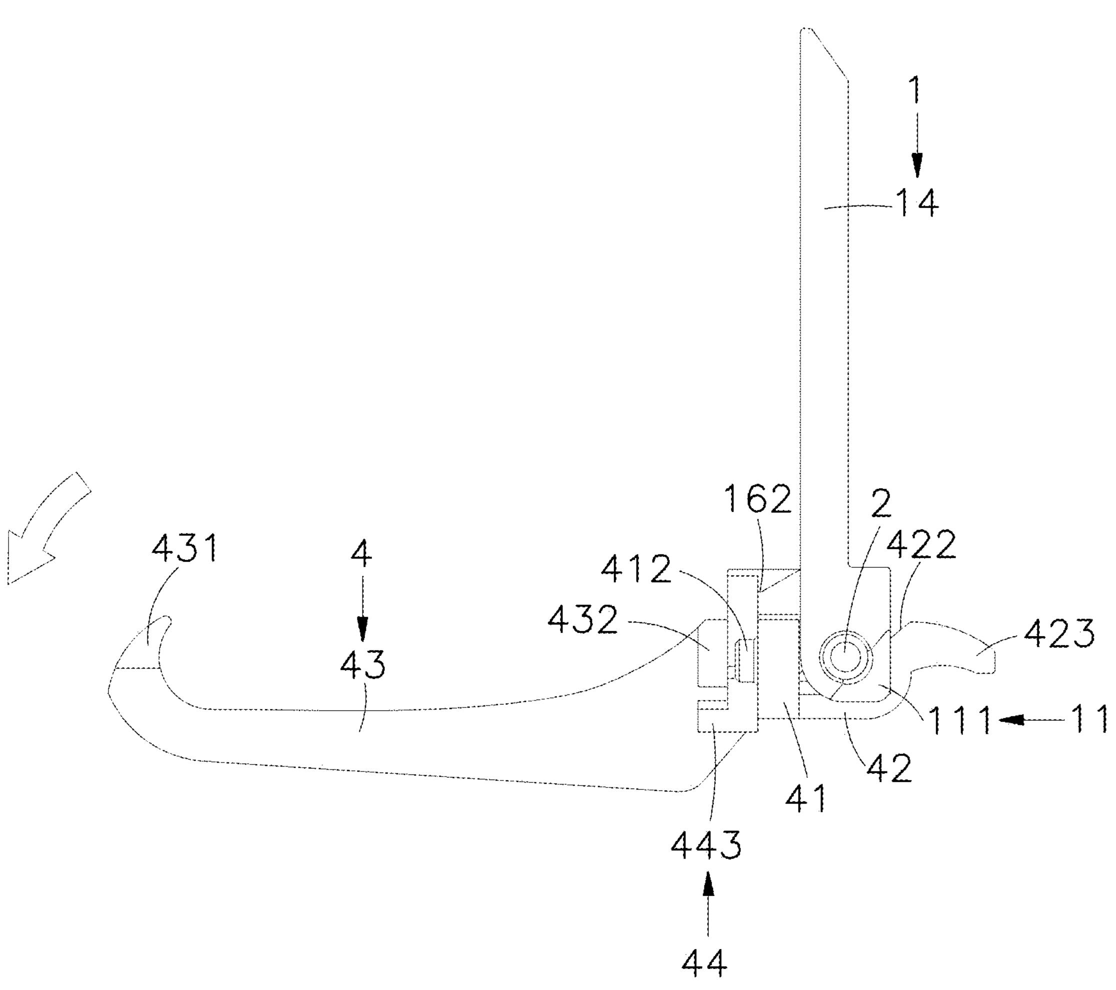
FIG. 7 is a top view of the dual-axis handle of the present invention during operation in the first action.
Figure 8:
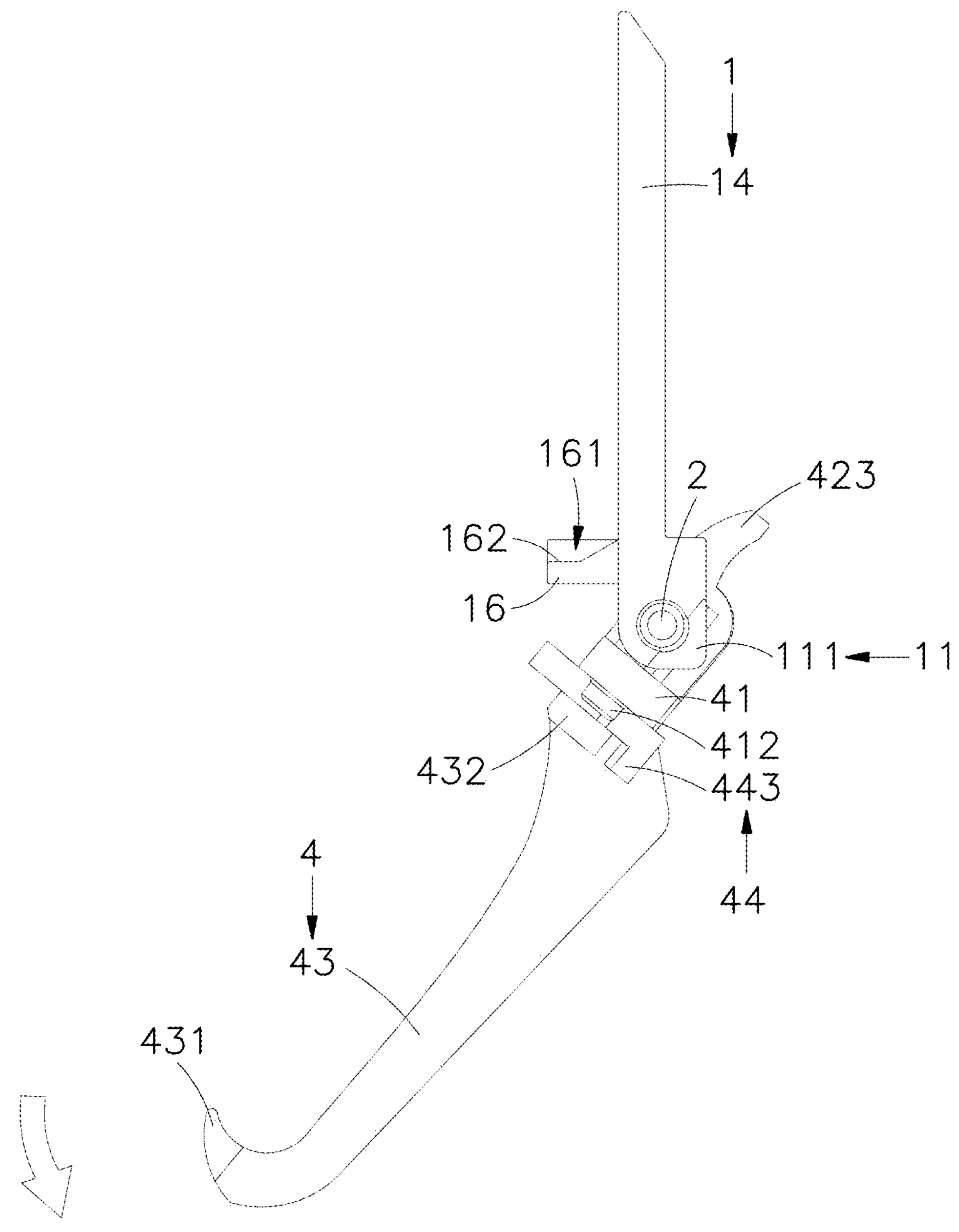
FIG. 8 is a top view of the dual-axis handle of the present invention during operation in the second action.
Figure 9:
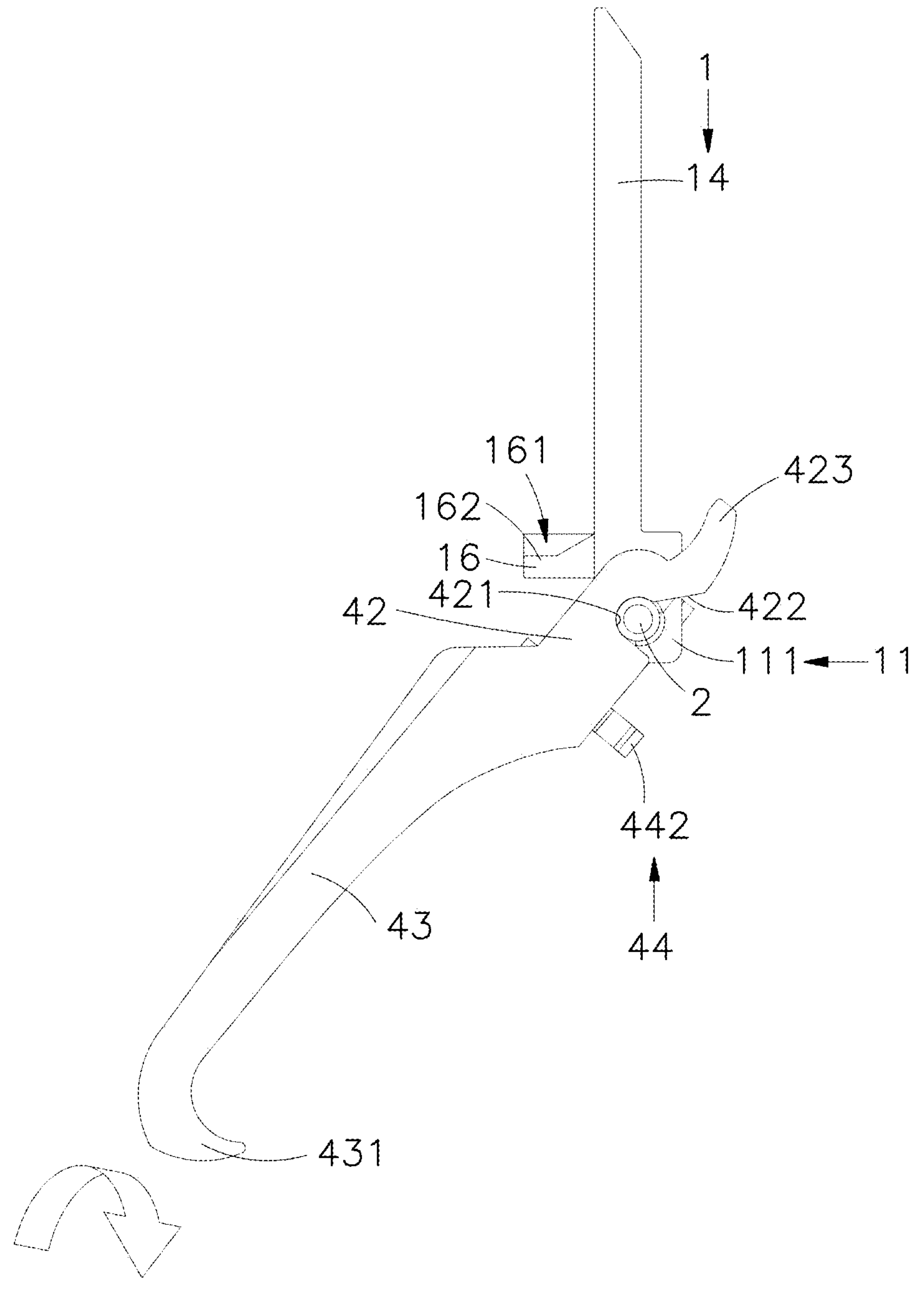
FIG. 9 is a top view of the dual-axis handle of the present invention during operation in the third action.

In order to achieve the above objects and effects, the technical means and structures adopted by the present invention are described in detail below with respect to the preferred embodiment of the present invention, so as to facilitate a complete understanding.

Please refer to FIGS. 1 to 6, which are three-dimensional external view of the dual-axis handle of the present invention, three-dimensional external view of the dual-axis handle of the present invention from another viewing angle, three-dimensional exploded view of the dual-axis handle of the present invention, three-dimensional exploded view of the dual-axis handle of the present invention from another viewing angle, three-dimensional view of the dual-axis handles of the present invention installed on both sides of the chassis and three-dimensional view of an implementation example of the dual-axis handle of the present invention. As can be clearly seen from the figure, the dual-axis handle of the present invention mainly comprises a base 1, a first pivot 2, a swing shaft 3 and a handle 4, and its main components and features are described in detail as follows:

The base 1 comprises an axial hole 10.

The first pivot 2 is inserted into the axial hole 10 and partially exposed from the base 1.

The swing shaft 3 comprises a shaft body 31 pivotally connected to the outside of the first pivot 2 and can be rotated 90 degrees in the horizontal direction, and a second pivot 32 extended from one side of the shaft body 31 and arranged in a vertical direction to the first pivot 2.

The handle 4 comprises a connecting body 41 pivotally connected to the second pivot 32, and a connecting groove 421 provided on one side of the connecting body 41 for receiving the partially exposed first pivot 2. The handle 4 can be rotated 180 degrees in a vertical direction at the second pivot 32.

The above-mentioned base 1 comprises a first shaft seat 11 and a second shaft seat 12, and a first axial hole 101 and a second axial hole 102 are respectively formed in the first shaft seat 11 and the second shaft seat 12 to form the above-mentioned axial hole 10. A positioning space 13 for accommodating the swing shaft 3 is formed between the first shaft seat 11 and the second shaft seat 12. The first shaft seat 11 has a first guide surface 111 extending obliquely downward and outward from the first axial hole 101. The second shaft seat 12 has a second guide surface 121 extending obliquely upward and outward from the second axial hole 102.

The part of the first shaft seat 11 of the base 1 facing the connecting body 41 of the handle 4 is in an arc shape, and a first positioning groove 112 and a second positioning groove 113 are recessed in the arc-shaped part. The part of the second shaft seat 12 of the base 1 facing the connecting body 41 of the handle 4 is in an arc shape, and a third positioning groove 122 and a fourth positioning groove 123 are recessed in the arc-shaped part. The first positioning groove 112, the second positioning groove 113, the third positioning groove 122 and the fourth positioning groove 123 are used for a positioning bead 4111 of a positioning device set 411 assembled inside the connecting body 41 to be held and positioned, and form a segmented positioning structure with multiple horizontal and vertical angles for the handle 4 on the base 1.

The above-mentioned positioning device set 411 comprises an extension body 412 protruding outward from the connecting body 41, and a receiving chamber 4120 for receiving an elastic member 4112 formed by a spring and the positioning bead 4111 is formed inside the extension body 412. When the positioning bead 4111 is accommodated in the first positioning groove 112, the inner angle between the handle 4 and the base 1 is about 90 degrees. When the positioning bead 4111 is accommodated in the second positioning groove 113, the inner angle between the handle 4 and the base 1 is about 135 degrees. When the positioning bead 4111 is accommodated in the third positioning groove 122, the inner angle between the handle 4 and the base 1 is about 135 degrees. When the positioning bead 4111 is accommodated in the fourth positioning groove 123, the inner angle between the handle 4 and the base 1 is about 180 degrees.

The above-mentioned base 1 further comprises a seat plate 14 extending outward from one side of the first shaft seat 11 and the second shaft seat 12, and a limiting wall 15 extending outward from the second axial hole 102 is provided on the side of the seat plate 14 adjacent to the second shaft seat 12. When the handle 4 is in the storage state, the limiting wall 15 and the connecting groove 421 of the handle 4 form a structure that contacts with the outside of the first pivot 2.

The shaft body 31 of the swing shaft 3 has a through hole 310 for the first pivot 2 to pass through and pivotally connect. The second pivot 32 is protruded from one side of the shaft body 31 and pivotally connected to a third axial hole 410 of the connecting body 41. The second pivot 32 is recessed to form a circular groove 320, and a stopper 33 composed of a head 331 and a positioning rod 332 is inserted and fixed in the circular groove 320 through the positioning rod 332.

The connecting body 41 of the handle 4 comprises the third axial hole 410 for the second pivot 32 to be inserted and positioned, and a locking arm 42 for locking in a preset locking seat 61 and an operating portion 43 for force application are formed on both sides of the connecting body 41. A hook portion 431 is formed at the end of the operating portion 43 and is engaged with a preset positioning seat (not shown). The connecting groove 421 and a guide slope 422 that contacts the first guide surface 111 or the second guide surface 121 are formed inside the locking arm 42. A zigzag positioning portion 423 is formed at the end of the locking arm 42 and can be inserted into the preset locking seat 61 coupled to a preset rack 6; and a through hole 4210 for receiving a magnetic member 4211 (for example, a permanent magnet made of neodymium iron boron) is formed in the vertical wall surface of the connecting groove 421. The magnetic member 4211 and the first pivot 2 made of a magnetically conductive material (such as iron, stainless steel or a nickel-containing alloy) generate a magnetic attraction, so that the connecting groove 421 and the first pivot 2 are in a fitted state.

The above-mentioned handle 4 is provided with a vertical plate 432 protruding from the operating portion 43 and adjacent to the connecting body 41. An assembly space 430 for accommodating a swivel hook 44 is formed between the vertical plate 432 and the connecting body 41. The vertical plate 432, the connecting body 41 and the swivel hook 44 respectively have a through slot 4320, a fixing slot 413 and a through hole 440 for a pin 4321 to be inserted and fixed, so that the swivel hook 44 can rotate in the assembly space 430. The connecting body 41 is provided with a stopper block 414 at the bottom side thereof corresponding to the swivel hook 44. A buckle seat 16 with a buckle groove 161 is provided at the buckle position of the seat plate 14 of the base 1 corresponding to the swivel hook 44, and the buckle groove 161 is an L-shaped groove and a stop wall 162 is formed at the vertical position of the buckle groove 161 for the swivel hook 44 to be supported and positioned.

The above-mentioned swivel hook 44 comprises the through hole 440 passing through the center and a receiving chamber 441 for receiving a rotary reset member 45 provided on one side thereof corresponding to the through hole 440. The swivel hook 44 has two ends respectively formed with a hook-shaped engaging portion 442 for engaging in the buckle groove 161 of the buckle seat 16 and an unlocking portion 443 for force application. The rotary reset member 45 is composed of a torsion spring.

When assembling the dual-axis handle of the present invention, the swing shaft 3 is first placed in the positioning space 13 of the base 1, and the first axial hole 101, the through hole 310 and the second axial hole 102 are aligned, and then the first pivot 2 is penetrated and positioned and partially exposed at the limiting wall 15 of the base 1. After the positioning device set 411 is set in the handle 4 and the handle 4 is placed under the base 1, the second pivot 32 is inserted into the third axial hole 410 of the handle 4, and the positioning rod 332 of the stopper 33 is inserted into the circular groove 320 in the second pivot 32 to form a fixing, and the positioning bead 4111 of the positioning device set 411 is held and positioned in one of the first positioning groove 112, the second positioning groove 113, the third positioning groove 122 or the fourth positioning groove 123. Then, the first pivot 2 is partially inserted into the connecting groove 421 of the handle 4 to form a positioning. After the rotary reset member 45 is positioned in the receiving chamber 441 of the swivel hook 44 and the swivel hook 44 is placed in the assembly space 430 of the handle 4, the pin 4321 is inserted into the through slot 4320 of the vertical plate 432, the fixing slot 413 of the connecting body 41 and the through hole 440 of the swivel hook 44 to form a fixing. The swivel hook 44 can rotate in the assembly space 430 and the hook-shaped engaging portion 442 can be engaged in the buckle seat 16, and the assembly of the dual-axis handle is completed through the above steps.

Figure 10:
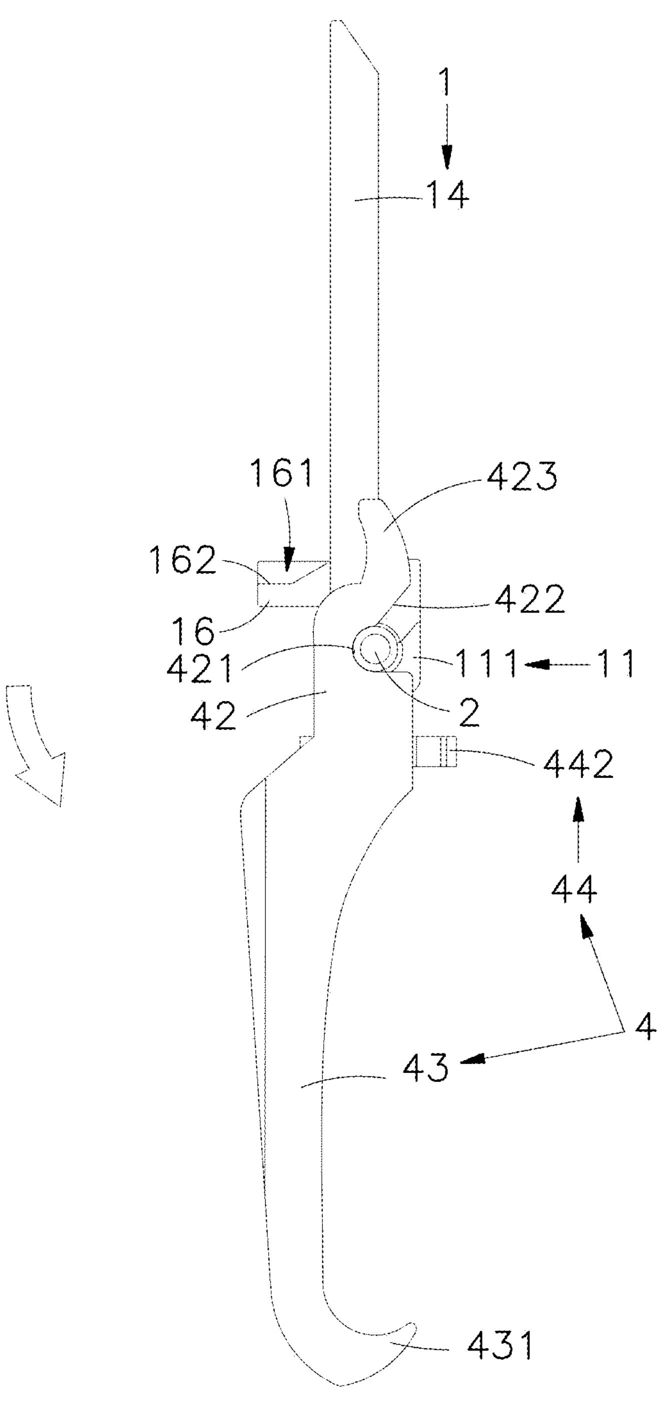
FIG. 10 is a top view of the dual-axis handle of the present invention during operation in the fourth action.
Figure 11:
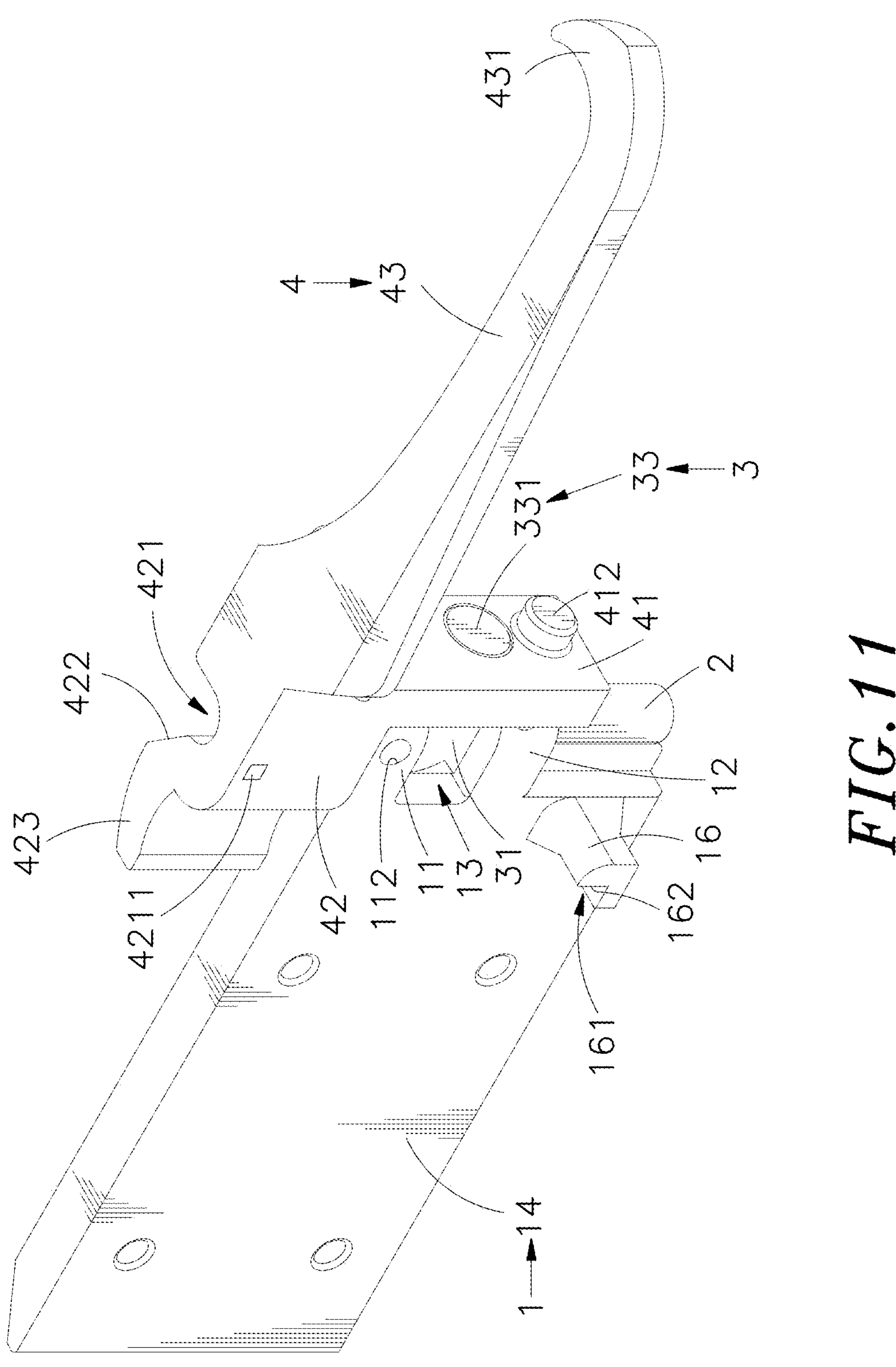
FIG. 11 is a three-dimensional view of FIG. 10.

Please refer to FIGS. 7 to 11, which are top view of the dual-axis handle of the present invention during operation in the first action, top view of the dual-axis handle of the present invention during operation in the second action, top view of the dual-axis handle of the present invention during operation in the third action, top view of the dual-axis handle of the present invention during operation in the fourth action and three-dimensional view of FIG. 10.

When the two disclosed dual-axis handles are in practical application, the dual-axis handles are first installed on two sides of a device box 5, and symmetrical racks 6 are provided on both sides of the device box 5. The preset locking seats 61 are provided on the racks 6 for positioning the handles 4 respectively in the storage state. A preset positioning seat (not shown) is provided in the middle of the front of the device box 5 for the hook portions 431 of the two handles 4 to be engaged and positioned, and rails 62 are provided between the adjacent racks 6 on both sides. When unlocking is desired, force is applied to press the unlocking portion 443 of the swivel hook 44 to lift the hook-shaped engaging portion 442 and to disengage the hook-shaped engaging portion 442 from the buckle groove 161 of the buckle seat 16. Then, the handle 4 can be rotated outward in a horizontal direction from the storage position (the positioning bead 4111 is held and positioned in the first positioning groove 112) at an inner angle of about 90 degrees between the handle 4 and the base 1 to disengage from the engagement state with the preset locking seat 61. After the swing shaft 3 is rotated horizontally in the base 1 and the inner angle between the handle 4 and the base 1 is about 135 degrees (the positioning bead 4111 is held and positioned in the second positioning groove 113), force can be applied to the two handles 4 to drag the device box 5 outward along the rails 62 in the first stage, and then the handles 4 are rotated vertically upward by 180 degrees with the respective second pivot 32 as the axis (At this time, the inner angle between the handle 4 and the base 1 is still 135 degrees, and the guide slopes 422 of the handles 4 slide upward from the respective second guide surfaces 121 to the respective first guide surfaces 111, and the positioning beads 4111 move downward from the respective second positioning grooves 113 to be positioned in the respective third positioning grooves 122). Then rotate the two handles 4 outward and make them have an inner angle of about 180 degrees with the respective bases 1 (the positioning beads 4111 are held and positioned in the respective fourth positioning grooves 123) to avoid mechanical interference between the handles 4 and the racks 6. That is, force can be applied to the two handles 4 to completely pull the device box 5 outward along the rails 62 in the second stage, so as to facilitate the maintenance or replacement of the electronic components (not shown) inside the device box 5.

The above is merely a preferred embodiment of the present invention and is not intended to limit the patent scope of the present invention. Therefore, all simple modifications and equivalent structural changes made by using the contents of the description and drawings of the present invention should be included in the patent scope of the present invention and should be declared.

In summary, the dual-axis handle of the present invention can achieve its effect and purpose in practical application. Therefore, this invention is truly a research and development creation with excellent practicality. In order to meet the application requirements for invention patents, we have filed an application in accordance with the law. We hope that the review committee will approve this case as soon as possible to protect the inventor's hard work in research and development. If the review committee has any questions, please feel free to write to us for instructions. The inventor will do his best to cooperate and we will be very grateful.

What is claimed is:

1. A dual-axis handle, comprising:

a base comprising an axial hole;

a first pivot inserted into said axial hole and partially exposed from said base;

a swing shaft comprising a shaft body pivotally connected to the outside of said first pivot and rotates 90 degrees in the horizontal direction, and a second pivot extended from one side of said shaft body and arranged in a transverse direction to said first pivot; and a handle comprising a connecting body pivotally connected to said second pivot and a connecting groove provided on one side of said connecting body for receiving the partially exposed said first pivot, said handle rotates 180 degrees in a vertical direction at said second pivot.

2. The dual-axis handle as claimed in claim 1, wherein said base further comprises a first shaft seat, a second shaft seat, a first axial hole and a second axial hole respectively formed in said first shaft seat and said second shaft seat to form said axial hole, a positioning space formed between said first shaft seat and said second shaft seat for accommodating said swing shaft, a first guide surface formed in said first shaft seat and extending obliquely downward and outward from said first axial hole, and a second guide surface formed in said second shaft seat and extending obliquely upward and outward from said second axial hole.

3. The dual-axis handle as claimed in claim 2, wherein said first shaft seat of said base comprises a first positioning groove and a second positioning groove recessed in an arc-shaped part thereof and facing said connecting body of said handle; said second shaft seat of said base comprises a third positioning groove and a fourth positioning groove recessed in an arc-shaped part thereof and facing said connecting body of said handle; said handle further comprises a positioning device set with a positioning bead assembled inside said connecting body; said first positioning groove, said second positioning groove, said third positioning groove and said fourth positioning groove are used for said positioning bead of said positioning device set to be held and positioned, and form a segmented positioning structure with multiple horizontal and vertical angles for said handle on said base.

4. The dual-axis handle as claimed in claim 3, wherein said positioning device set comprises an extension body protruding outward from said connecting body, an elastic member formed by a spring and a receiving chamber formed inside said extension body for receiving said elastic member and said positioning bead, so that when said positioning bead is accommodated in said first positioning groove, the inner angle between said handle and said base is about 90 degrees; when said positioning bead is accommodated in said second positioning groove, the inner angle between said handle and said base is about 135 degrees; when said positioning bead is accommodated in said third positioning groove, the inner angle between said handle and said base is about 135 degrees; when said positioning bead is accommodated in said fourth positioning groove, the inner angle between said handle and said base is about 180 degrees.

5. The dual-axis handle as claimed in claim 2, wherein said base further comprises a seat plate extending outward from one side of said first shaft seat and said second shaft seat, and a limiting wall extending outward from said second axial hole is provided on the lateral side of said seat plate adjacent to said second shaft seat; said limiting wall and said connecting groove of said handle form a structure that contacts with the outside of said first pivot when said handle is in a storage state.

6. The dual-axis handle as claimed in claim 2, wherein said shaft body of said swing shaft is provided with a through hole for said first pivot to pass through and pivotally connect; said second pivot is protruded from one side of said shaft body and pivotally connected to a third axial hole of said connecting body, said second pivot being recessed to form a circular groove; said swing shaft further comprises a stopper composed of a head and a positioning rod and inserted and fixed in said circular groove through said positioning rod.

7. The dual-axis handle as claimed in claim 2, wherein said connecting body of said handle comprises a third axial hole for said second pivot to be inserted and positioned, a locking arm for locking in a preset locking seat and an operating portion for force application respectively formed on two opposite sides of said connecting body, a hook portion formed at the end of said operating portion and for engaging with a preset positioning seat; said connecting groove and a guide slope that selectively contacts said first guide surface or said second guide surface formed inside said locking arm, a zigzag positioning portion formed at the end of said locking arm for inserting into said preset locking seat coupled to a preset rack, and a through hole for receiving a magnetic member formed in the vertical wall surface of said connecting groove; said first pivot is made of a magnetically conductive material so that said magnetic member and said first pivot generate a magnetic attraction, so that said connecting groove and said first pivot are in a fitted state.

8. The dual-axis handle as claimed in claim 7, wherein said handle further comprises a vertical plate protruding from said operating portion and adjacent to said connecting body, an assembly space formed between said vertical plate and said connecting body, a swivel hook accommodated in said assembly space, a through slot, a fixing slot and a through hole respectively formed on said vertical plate, said connecting body and said swivel hook for a pin to be inserted and fixed, so that said swivel hook is rotatable in said assembly space, and a stopper block provided at a bottom side of said connecting body corresponding to said swivel hook; said base further comprises a buckle seat provided at a buckle position on said seat plate corresponding to said swivel hook, an L-shaped buckle groove located at said buckle seat, and a stop wall formed at a vertical portion of said buckle groove for said swivel hook to be supported and positioned.

9. The dual-axis handle as claimed in claim 8, wherein said swivel hook has said through hole passing through the center thereof, and comprises a rotary reset member, a receiving chamber provided on one side thereof corresponding to said through hole of said swivel hook for receiving said rotary reset member, and a hook-shaped engaging portion for engaging in said buckle groove of said buckle seat and an unlocking portion for force application respectively formed at two opposite ends of said swivel hook, said rotary reset member being composed of a torsion spring.

* * * * *